(12) United States Patent
Hubbard

(10) Patent No.: US 7,149,275 B1
(45) Date of Patent: Dec. 12, 2006

(54) INTEGRATED CIRCUIT AND METHOD OF IMPLEMENTING A COUNTER IN AN INTEGRATED CIRCUIT

(75) Inventor: John R. Hubbard, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 41 days.

(21) Appl. No.: 10/769,664

(22) Filed: Jan. 29, 2004

(51) Int. Cl.
*H03K 21/00* (2006.01)
*H03K 23/00* (2006.01)

(52) U.S. Cl. .................... 377/47; 377/34; 377/106; 327/115; 327/117

(58) Field of Classification Search .............. 377/34, 377/47, 106; 322/115, 117
See application file for complete search history.

(56) References Cited

U.S. PATENT DOCUMENTS

| | | | | |
|---|---|---|---|---|
| 5,249,054 A | * | 9/1993 | Ihara et al. .................. 348/241 |
| 5,524,035 A | * | 6/1996 | Casal et al. .................. 377/47 |
| 5,559,844 A | * | 9/1996 | Lee .............................. 377/116 |
| 6,157,694 A | * | 12/2000 | Larsson ........................ 377/48 |
| 6,269,138 B1 | * | 7/2001 | Hansson ........................ 377/26 |
| 6,687,325 B1 | * | 2/2004 | Wells ............................ 377/26 |
| 6,759,886 B1 | * | 7/2004 | Nakanishi .................... 327/295 |
| 6,879,654 B1 | * | 4/2005 | Austin ........................... 377/48 |
| 6,961,015 B1 | * | 11/2005 | Kernahan et al. ........... 341/165 |

OTHER PUBLICATIONS

Xilinx, Inc.; "Low Power Design with CoolRunner-II CPLDs"; XAPP377; Application Note; May 8, 2002 (v1.0); available from www.xilinx.com; pp. 1-10.

* cited by examiner

*Primary Examiner*—Tuan T. Lam
(74) *Attorney, Agent, or Firm*—John J. King

(57) ABSTRACT

An integrated circuit, such as a programmable logic device, implements a single bit transition counter in logic. The counter preferably comprises a first stage receiving a clock signal having a first clock rate and generating a least significant bit in a count. A plurality of intermediate stages are coupled to the first stage, where each intermediate stage receives an output from the immediate previous stage and an inverted output of each other previous intermediate stage, and generates a next most significant bit in a count. Finally, a last stage of the counter receives an inverted output of each previous intermediate stage except the immediate intermediate previous stage and generating a most significant bit in a count.

8 Claims, 5 Drawing Sheets

Divide by 2
Clock Divider

-- Prior Art --

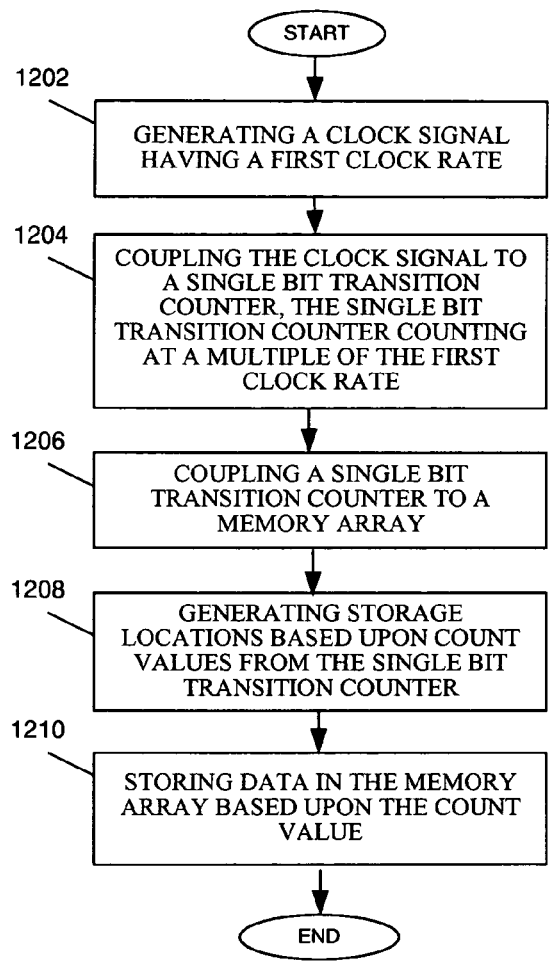
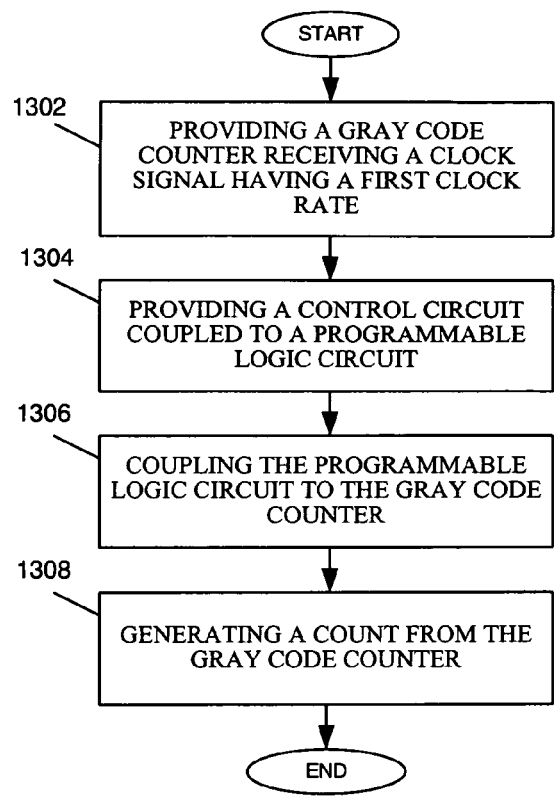
FIG. 12
FIG. 13

US 7,149,275 B1

INTEGRATED CIRCUIT AND METHOD OF IMPLEMENTING A COUNTER IN AN INTEGRATED CIRCUIT

FIELD OF THE INVENTION

The present invention relates generally to integrated circuits, and in particular, to a method of implementing a counter in an integrated circuit.

BACKGROUND OF THE INVENTION

In addition to there being many different numerical systems, such as binary systems, base eight systems, decimal systems, etc, there are often different ways of counting within those systems. In a binary based system, a digit of a particular number is either represented by a "1" or a "0". When such systems are used for counting, the values of the digits are changed. For example, when counting in a binary system, the binary number "0010" becomes "0011" when the number is incremented. However, conventional counting in a binary system also provides for the use of a "carry" number. That is, when a value in a binary system is incremented, a bit having a "1" may be changed to a "0" and a "1" is added to the next most significant bit. For example, when incrementing a count of the binary value "0111", the resulting value will be "1000". A "1" is carried in each of the first three bits and added to the adjacent more significant bit. Such counting using a carry number can lead to the changing of may bits. As can be seen in the example above, all four bits are changed. Such changing of bits can have a negative impact on the performance of a electronic circuit implementing a counter by having greater complexity, slower speed, increased power consumption, etc.

Efforts have been made to provide simpler counting systems based upon binary. A single bit transition counter, such as a Grey Code Counter was developed. A Grey Code represents each number in a sequence of intergers as a binary string of the length N in an order such that adjacent integers have Grey Code representations that differ in only one bit position; Incrementing a value in a Grey Code sequence therefore requires the changing of just one bit at a time. Grey Code Counters are often implemented using a state machine, and therefore explicitly require that every unique state be defined. In products that do not have single level wide logic decode capabilities, such as an FPGA, the Grey counter has been implemented using XOR gates between intermediate stages. Devices such as CPLDs have wide single level logic which can be used to decode the intermediate stages quickly, with identical delay times between stages. With larger Grey Code Counters, this can be quite a burden, requiring a prohibitively detailed description of a state machine, which is prone to data entry errors. For example, a 16 bit Grey Code Counter contains $2^{16}$ states, or 65536 states. Also, subsequent software compilation, as fitting for PLDs or ASICs, can also be quite demanding where the fitter may never reach a conclusion, and if so may be logically inefficient.

Accordingly, there is a need for an improved integrated circuit and method of implementing a counter in an integrated circuit.

There is also a need for a counter for use in integrated circuits having reduced power consumption compared to conventional devices.

There is a further need for a counter which can be implemented in software compilers having reduce fit/compile times.

SUMMARY OF THE INVENTION

A single bit transition counter uses a simple logic design to avoid the tedium in creating a counter as a state machine. The counter is implemented in a more efficient manner than conventional counters. According to one embodiment, an integrated circuit, such as a programmable logic device has a counter comprising a first stage receiving a clock signal having a first clock rate and generating a least significant bit in a count. A plurality of intermediate stages are coupled to the first stage, where each intermediate stage receives an output from the immediate previous stage and an inverted output of each other previous intermediate stage, and generates a next most significant bit in a count. Finally, a last stage of the counter receives an inverted output of each previous intermediate stage except the immediate intermediate previous stage and generating a most significant bit in a count. A power savings of ⅓ that of a conventional binary counter may be provided with twice the count speed. An alternate embodiment of the present invention employs a divider circuit, thereby providing a counter that uses approximately ⅓ the power consumption of conventional counters while counting at the same speed of a conventional binary counter. The embodiments of the present invention enable a fitter software feature to quickly implement such a counter, when it is recognized in the source code description. Compile/fit times will be improved over conventional methods, particularly with an Intregrated Software Environment (ISE) software.

BRIEF DESCRIPTION OF THE DRAWINGS

FIG. 12 is a flow chart showing a method of storing data in a memory using a counter according to an embodiment of the present invention.

FIG. 13 is a flow chart showing a method of controlling a programmable logic circuit using a counter according to an embodiment the present invention.

DETAILED DESCRIPTION OF THE DRAWINGS

Figure 1:
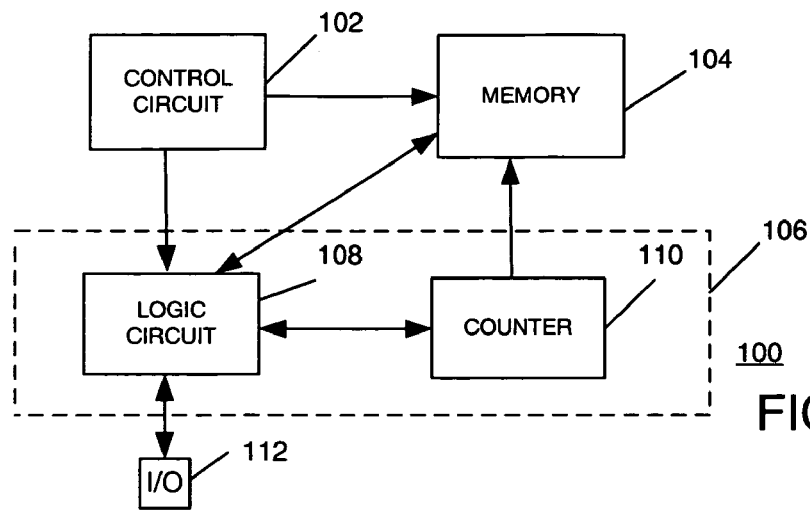
FIG. 1 is a block diagram of an integrated circuit according to the present invention.

Turning first to FIG. 1, a block diagram of an integrated circuit according to the present invention is shown. In particular, an integrated circuit 100 comprises a control circuit 102 coupled to a memory 104 and logic block 106. The logic block comprises a logic circuit 108 which controls a counter 110. The logic circuit 108 generates an output by way of an input/output port 112. Specific implementations and application of the integrated circuit of FIG. 1 will be described in more detail with reference to remaining figures.

Below is a description of the Grey Code for a 5 bit counter as is well known in the art, where the least significant bit (LSB) is on the right and the most significant bit (MSB) is on the left.

```
43210
00000
00001
00011
00010
00110
00111
00101
00100
01100
01101
01111
01110
01010
01011
01001
01000
11000
11001
11011
11010
11110
11111
11101
11100
10100
10101
10111
10110
10010
10011
10001
10000
```

The above, of course, repeats when it reaches the end. For an N bit counter, there are $2^N$ states. Therefore, a 5 bit Grey Code counter has 32 states, as shown above. It should be noted that a pattern evolves with the count, and all bits follow the same pattern, with the exception of the LSB (bit 0) and the MSB (bit 4). The common bits (for example, bit 3) will not only toggle at a well known time sequence, but also when at the center of the HIGH period of the next least significant bit (bit 2 in this case). This occurs when the next least significant bit is HIGH (bit 2 in this case) and all other lesser bits are LOW (bits 1 and 0). Bit 1 follows the same rule, but there is only one lesser bit, bit 0. Bit 1 will toggle at the half way point of bit 0 being HIGH. This requires that bit 0 clock on the opposite edge as compared to bit 1. Therefore, all bits clock on the same edge except bit 0, the LSB. The MSB is different in that it toggles when all lesser bits are LOW and ignores the next least significant bit. In other words, bit 4 (MSB) toggles when bits 2,1 and 0 are all LOW. Bit 3 is a don't care.

Based upon the above analysis, the following equations shown in VHDL code describe the operation of a 5 bit counter generating a Grey Code sequence.

$t(0)<='1'$;

$t(1)<=q(0)$;

$t(2)<=q(1)$ and not q(0);

$t(3)<=q(2)$ and not q(1) and not q(0);

$t(4)<=$ not q(2) and not q(1) and not q(0);

Where t(n) is the input of a T flip flop and q(n) is the output of a T flip flop. It should be noted that t(0) is clocked on the inverted clock, or falling edge in this example. The remaining bits clock on the non-inverted clock, or rising edge. The first bit in the equations for t(1), t(2), and t(3) is not inverted, following the rule that the next least significant bit is to be HIGH for that bit to toggle. Also, the remaining bits in equations t(2) and t(3) are inverted following the rule that all lesser significant bits must be LOW. Equation t(4) has all bits inverted following the rule that all lesser bits (bits 2, 1 and 0) must be LOW and the immediate next less significant bit (bit 3) is a don't care. Similarly, an N-bit counter can be implemented according to the following equations:

$t(0)<='1'$;

$t(1)<=q(0)$;

$t(2)<=q(1)$ and not q(0);

$t(3)<=q(2)$ and not q(1) and not q(0);

.

.

.

$t(N-1)<=q(N-2)$ and not q(N-3) and not q(N-4) . . . and not q(0);

$t(N)<=$ not q(N-2) and not q(N-3) and not q(N-4) . . . and not q(0).

Figure 2:
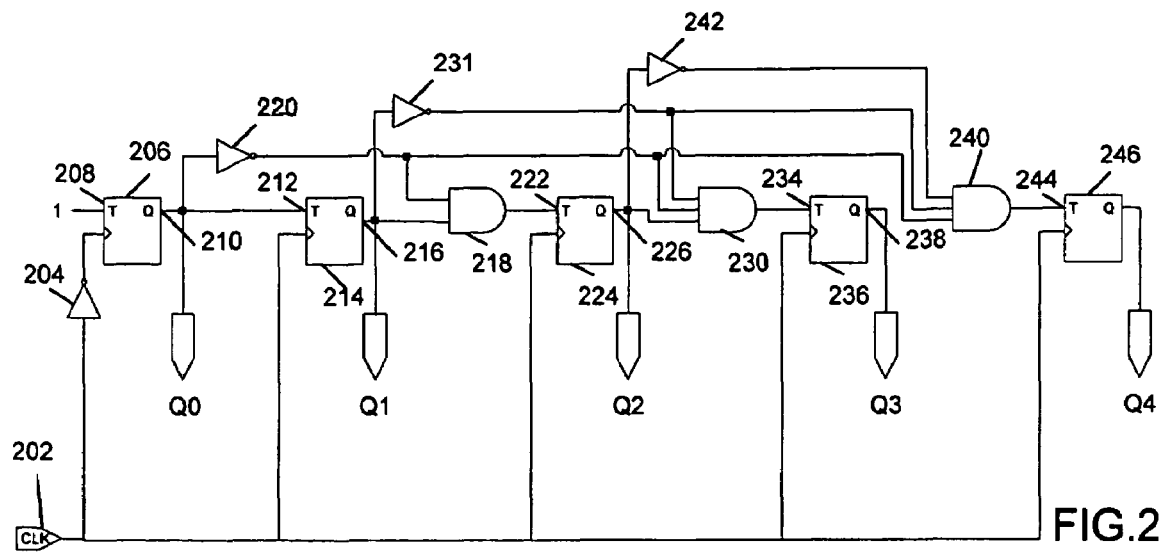
FIG. 2 is a circuit diagram of a counter according to the present invention.

Turning now to FIG. 2, a circuit diagram of a counter 110 according to an embodiment of the present invention is shown. The circuit of FIG. 2 implements the equations set forth above related to a 5 bit counter to generate a 5 bit Grey Code count sequence. In particular, a clock signal CLK, which is coupled to a plurality of T flip flop stages, is coupled to an inverter 204 which generates an inverted clock signal to a flip flop 206 in a first stage receiving a HIGH signal at input 208. An output Q0 is generated at an output 210, and coupled to an input 212 of a second stage flip flop 214. The second stage flip flop 214 generates an output signal Q1 at an output 216. The output Q1 is also coupled to an AND gate 218. The output signal Q0 from the first stage flip flop 206 is also coupled to an inverter 220, the output of which is also coupled to the AND gate 218.

The output of AND gate 218 is coupled to an input 222 of a third stage flip flop 224. The third stage flip flop 224 generates an output signal Q2 at an output 226. The output Q2 is also coupled to an AND gate 230. The output of the inverter 220 is also coupled to the AND gate 230. Finally, the output Q1 is coupled to an inverter 231, the output of which is coupled to the AND gate 230. The output of AND gate 230 is coupled to an input 234 of a fourth stage flip flop 236. An output Q3 of the fourth stage flip flop is generated at an output 238. Finally an AND gate 240 receives the output of inverter 220, inverter 231 and a third inverter 242, which receives the output Q2. The AND gate 240 is coupled to an input 244 of a fifth stage flip flop 246 which generates an output Q4.

In summary, the counter of FIG. 2 comprises a first stage of receiving a clock signal having a first clock rate and generating a least significant bit in a count. A plurality of intermediate stages are coupled to the first stage, where each intermediate stage receives an output from the immediate previous stage and an inverted output of each other previous intermediate stage, and generates a next most significant bit in a count. Finally, a last stage of the counter receives an inverted output of each previous intermediate stage except the immediate intermediate previous stage and generates a most significant bit in a count. The counter is preferably implemented with T flip flops, and receives an inverted clock signal at its first stage.

Figure 3:
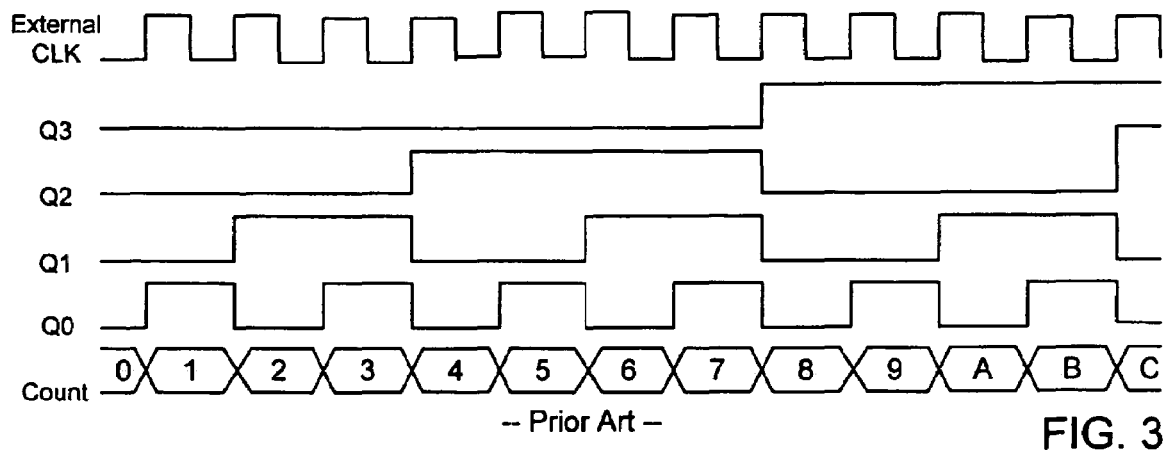
FIG. 3 is a timing diagram of a conventional binary counter.
Figure 4:
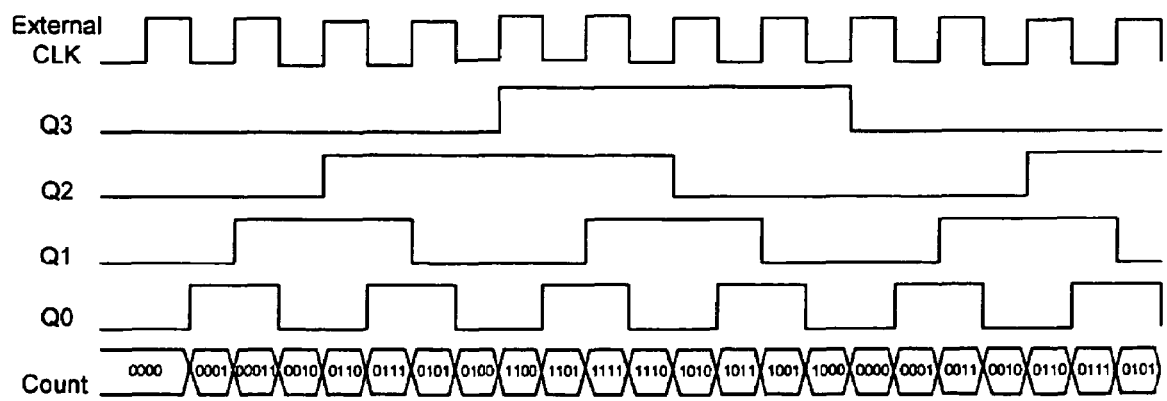
FIG. 4 is a timing diagram of the counter of FIG. 4 according to the present invention.

Turning now to FIGS. 3 and 4, timing diagrams for two counters are shown. The waveforms of FIG. 3 provide an example of a conventional binary counter. As can be seen, the states change on every rising edge of the clock. In contrast, the waveforms of FIG. 4 demonstrate a Grey Code counter employing the circuit of FIG. 2 showing the first 4 bits. In this case, the counter changes states on every clock edge (i.e. both rising and falling edges), yielding a rate of change of states that is twice that of the binary counter, using the same clock. This implementation provides the user with a method to have a counter that counts at twice the rate of a binary counter, and has the added avantage of saving power by operating at ½ the power consumption of a conventional binary counter at the same clock speed. Although a 5 bit counter is shown, the circuit could easily be modified for any N-bit counter as described above.

Figure 5:
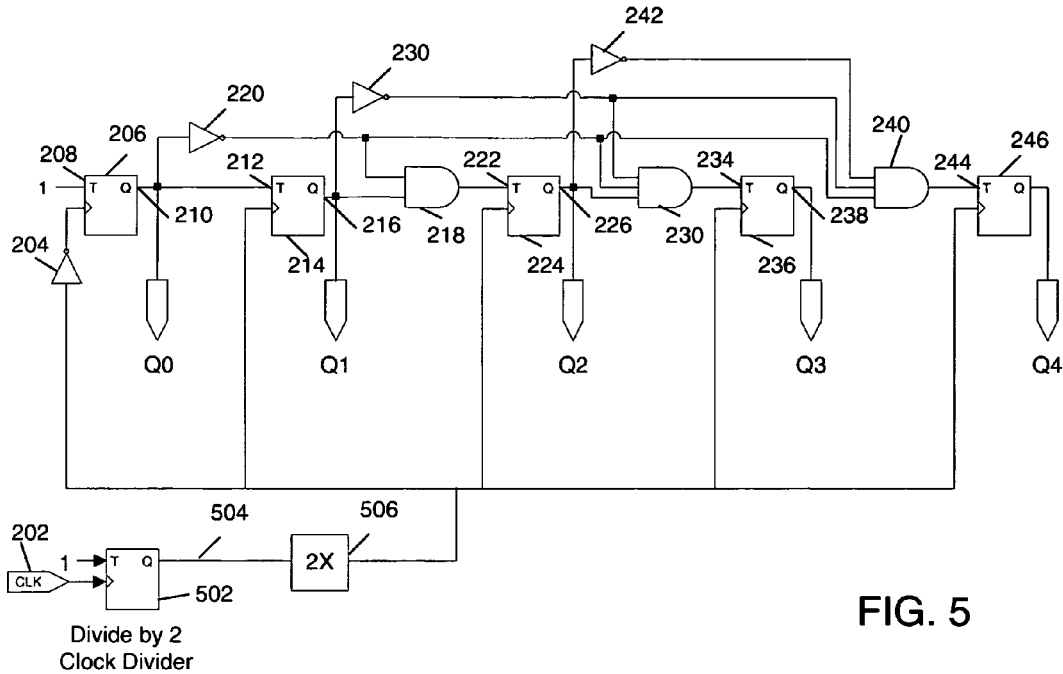
FIG. 5 is a circuit diagram of a counter according to an alternate embodiment of the present invention.

Turning now to FIG. 5, a circuit diagram of a counter according to an alternate embodiment of the present invention is shown. The circuit of FIG. 5 is the same as that of FIG. 2, except that a clock divider circuit 502 generates a divided clock signal 504. As shown the timing diagram of FIG. 6, the clock divider circuit is a divide by 2 clock divider, generating a divided clock signal at half the rate of the external clock. Unlike the counter of FIG. 2 which counts at twice the rate of a conventional binary counter if using a normal, non-divided clock, the counter of FIG. 5 will count at the same rate as a conventional binary counter if the clock speed is reduced by one half, but operating approximately ⅛ of the power consumption. Coupled with the correct decoder, the counter of FIG. 5 will allow a user to have a lower power counter than a conventional binary counter.

A clock doubler 506 can be optionally used together with a divide by 2 clock divider to provide a counter with 2× the count of a binary counter, yet further reduce power compared to a counter with no divider/doubler combination. The doubler 506 would be located after the divider 502. This is due to ½ the original clock frequency being present on the clock network between the divider and the doubler. This network can sometimes be physically lengthy and carry a large capacitive load for the post divider clock driver. Reducing the frequency on this network will lower power, yet the doubler returns the original frequency to the registers in the counter. Dividers and frequency multipliers can be used individually or together to generate a variety of clock frequencies to the counter which yields a counter with custom count rates and a variety of power savings.

Figure 6:
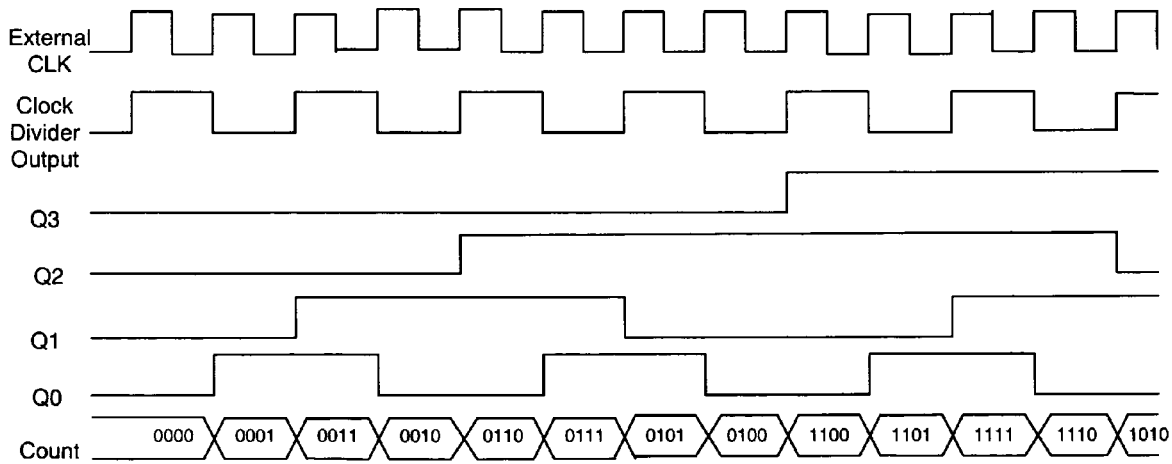
FIG. 6 is a timing diagram of the counter of FIG. 5 according to the present invention.

Turning now to FIG. 6, a timing diagram shows the first 4 bits of the counter of FIG. 5 without the clock doubler 506 according to the present invention is shown. As seen in the figure, the count toggles at every rising edge of the external clock, thereby matching the same rate of change of states as the binary counter. As can be seen, the counter changes states on both rising and falling edges of the divided clock signal of the clock divider output. But to the external system, it appears that the counter toggles on only rising edges of the external clock. It should be noted that the embodiment of FIG. 5 implementing the clock doubler 506 would lead to timing diagram of FIG. 4.

Figure 7:
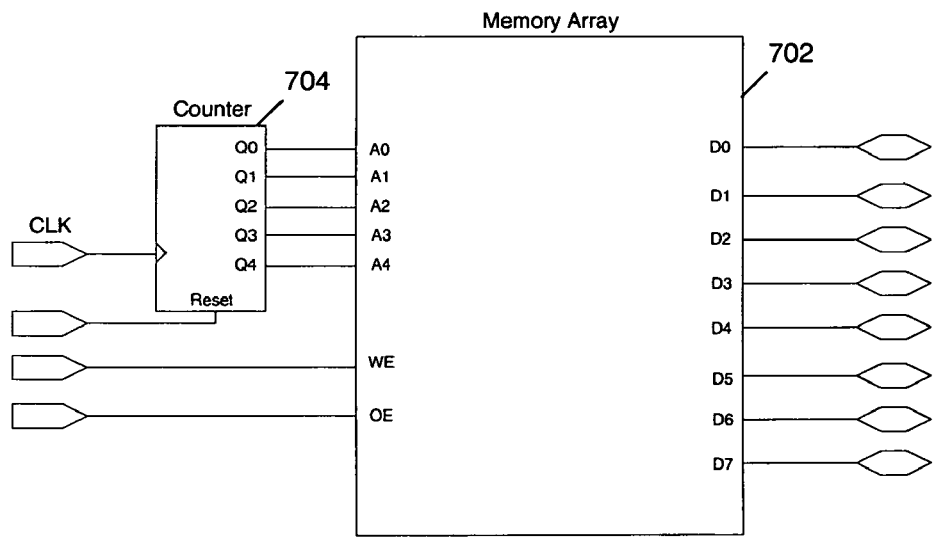
FIG. 7 is a block diagram of a memory device according to an embodiment of the present invention.

Turning now to FIG. 7, a block diagram of a memory device implementing the counter of FIG. 2 or FIG. 5 according to an embodiment of the present invention is shown. In particular, a memory array 702 is coupled to receive a counter 704. The arrangement of FIG. 7 can be used in any memory arrangement requiring mass storage where a counter is used to access memory locations for sequential storage and retrieval, such as a FLASH memory device. A method of employing a counter of the present invention with a memory is described in reference to FIG. 12.

Figure 8:
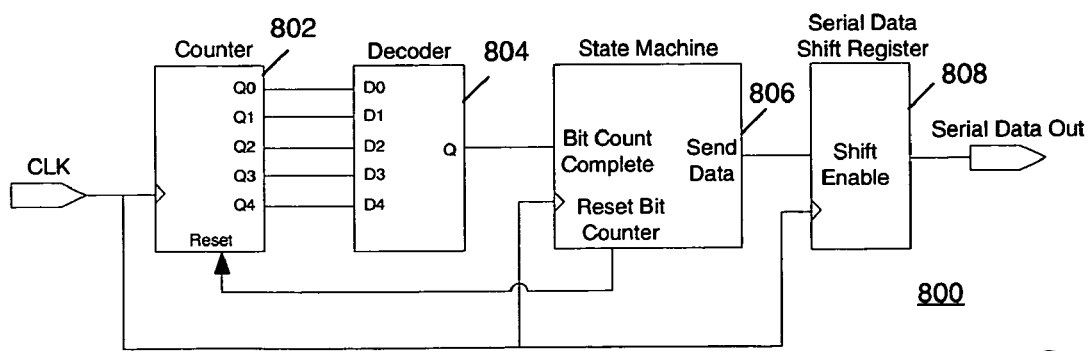
FIG. 8 is a block diagram of an integrated circuit according to an embodiment of the present invention.

Turning now to FIG. 8, a block diagram of an integrated circuit implementing the counter of FIG. 2 or FIG. 5 according to another embodiment of the present invention is shown. In particular, an integrated circuit 800 comprises a counter 802 receiving a clock signal CLK and generating a plurality of output signals (Q0–Q4) which are coupled to a decoder 804. The decoder couples output data to a state machine 806, which sends data to a serial data shift register 808. The arrangement of FIG. 8 can be used for generating configuration data for programmable logic devices, for example, or any other counting function of a programmable logic device. A method of employing a counter of the present invention with an IC is described in reference to FIG. 13. The integrated circuit 800 could be, for example, a programmable logic device, an application specification integrated circuit (ASIC), or any other device implementing the circuit of FIG. 8.

Figure 9:
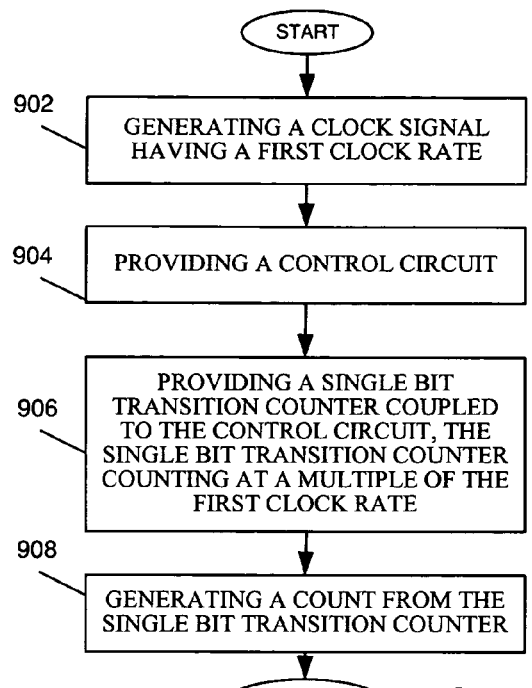
FIG. 9 is a flow chart showing a method of implementing a single bit transition counter according to one embodiment of the present invention.

Turning now to FIG. 9, a flow chart shows a method of implementing a single bit transition counter according to one embodiment of the present invention. In particular, a clock signal having a first clock rate is generated at a step 902. A control circuit is provided at a step 904, and a single bit transition counter is coupled to the control circuit at a step 906. The single bit transition counter counts at a multiple of the first clock rate, and generates a count at a step 908.

Figure 10:
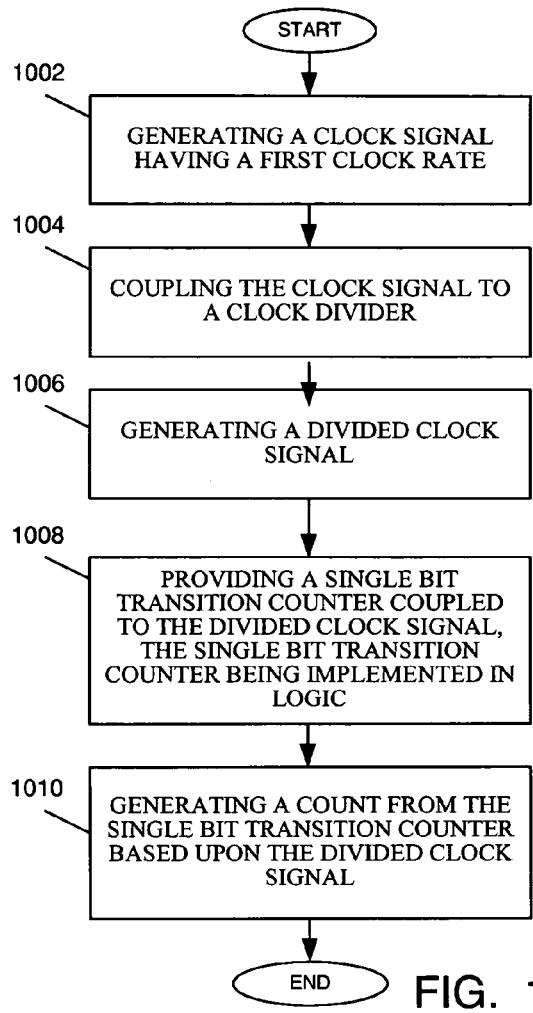
FIG. 10 is a flow chart showing a method of implementing a single bit transition counter having a modified clock signal according to an alternate embodiment of the present invention.

Turning now to FIG. 10, a flow chart shows a method of implementing a single bit transition counter having a modified clock signal according to an alternate embodiment of the present invention. In particular, a clock signal having a first clock rate is generated at a step 1002. The clock signal is coupled at a step 1004 to a clock divider which generates a divided clock signal at a step 1006. A single bit transition counter which is implemented in logic is coupled to the divided clock signal at a step 1008. Finally, a count is generated by the single bit transition counter based upon the divided clock signal.

Figure 11:
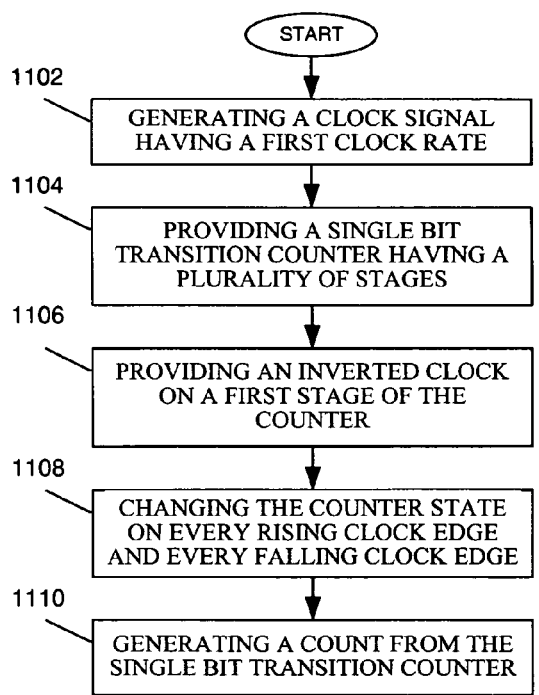
FIG. 11 is a flow chart showing a method of implementing a single bit transition counter having an inverted clock on a least significant bit according to a further embodiment of the present invention.

Turning now to FIG. 11, a flow chart shows a method of implementing a counter having an inverted clock on a least significant bit according to a further embodiment of the present invention. In particular, a clock signal having a first clock rate is generated at a step 1102. A single bit transition counter having a plurality of stages is provided at a step 1104. An inverted clock signal is provided on a first stage of the counter. The counter state is changed on every rising clock edge and every falling clock edge at a step 1108. Finally, a count is generated by the single bit transition counter at a step 1110.

Turning now to FIG. 12, a flow chart shows a method of storing data in a memory using a counter according to an embodiment of the present invention. In particular, a clock signal having a first clock rate is generated at a step 1202. The clock signal is coupled at a step 1204 to a single bit transition counter which counts at a multiple of the first clock rate. The single bit transition counter is coupled to a memory array at a step 1206. Storage locations based upon count values are generated by the single bit transition counter at a step 1208. Finally, data is stored in the memory array based upon the count value at a step 1210.

Turning now to FIG. 13, a flow chart shows a method of controlling a programmable logic circuit using a counter. In particular, a Grey code counter receives a clock signal having a first clock rate at a step 1302. A control circuit coupled to a programmable logic circuit is provided at a step 1304. The programmable logic circuit is coupled to the Grey code counter at a step 1306. A count from the Grey code counter is generated at a step 1308.

It can therefore be appreciated that the new and novel integrated circuit and method of implementing a counter in an integrated circuit has been described. Although the methods and circuits described find particular application in programmable logic devices, such as a field programmable gate array (FPGA) or complex programmable gate array, the methods and circuits could be employed in any type of electronic device or circuit requiring a counter, including any type of memory device. Although a Grey Code is described as a single bit transition counter, the methods of the present invention could be employed in other counters generating a count which varies by a single bit. It will be appreciated by those skilled in the art that, particular the teaching herein, numerous alternatives and equivalents will be seen to exist which incorporate the disclosed invention. As a result, the invention is not to be limited by the foregoing embodiments, but only by the following claims.

The invention claimed is:

1. A method of implementing a counter in an integrated circuit, said method comprising:
    receiving a clock signal having a first clock rate at a clock divider;
    coupling a divided clock signal from said clock divider to a clock network;
    multiplying said divided clock signal to generate a counter clock signal having a second clock rate;
    providing a plurality of intermediate stages of a counter, each intermediate stage being clocked at said second clock rate and receiving an output from an immediate previous intermediate stage and an inverted output of each other previous intermediate stage;
    providing a last stage of said counter receiving an inverted output of each previous intermediate stage except the immediate previous intermediate stage; and
    outputting a count at a rate which is a multiple of said second clock rate.

2. The method of claim 1 wherein said step of receiving a clock signal comprises a step of receiving an inverted clock at a first stage T flip flop of said counter.

3. The method of claim 1 further comprising a step of generating a least significant bit in a count at an output of said first stage.

4. The method of claim 1 further comprising a step of generating, at each intermediate stage, a next most significant bit in a count at an output.

5. The method of claim 1 further comprising a step of generating a most significant bit in a count at an output of said last stage.

6. A programmable logic device having a counter, said programmable logic device comprising:
    a clock divider coupled to receive a clock signal having a first clock rate and generate a divided clock signal having a second clock rate;
    a clock network coupled to receive said divided clock signal;
    a clock multiplier coupled to receive said divided clock signal and generate a counter clock signal at said first clock rate;
    a first stage of said counter receiving an inverted counter clock signal having a first clock rate and generating a least significant bit in a count;
    a plurality of intermediate stages of said counter, each intermediate stage being clocked at said first clock rate and receiving an output from the immediate previous intermediate stage and an inverted output of each other previous intermediate stage, and generating a next most significant bit in a count; and
    a last stage of said counter receiving an inverted output of each previous intermediate stage except the immediate previous intermediate stage and generating a most significant bit in a count, wherein said counter outputs a count at a rate which is a multiple of said first clock rate.

7. The programmable logic device of claim 6 wherein said count comprises a Grey code count sequence.

8. The programmable logic device of claim 6 wherein each stage of said counter comprises a T flip flop.

* * * * *